United States Patent [19]

Constant

[11] 4,082,991

[45] Apr. 4, 1978

[54] SUPERCONDUCTING ENERGY SYSTEM

[76] Inventor: James Nickolas Constant, 1603 Danbury Dr., Claremont, Calif. 91711

[21] Appl. No.: 625,188

[22] Filed: Oct. 23, 1975

Related U.S. Application Data

[63] Continuation-in-part of Ser. No. 487,597, Jul. 11, 1974, abandoned.

[51] Int. Cl.² .................. H02J 15/00; G11C 11/44
[52] U.S. Cl. ........................... 320/1; 307/306; 365/160; 357/24
[58] Field of Search .............. 340/173.1; 307/306; 317/242, 258; 320/1; 357/24

[56] References Cited

U.S. PATENT DOCUMENTS

| | | | |
|---|---|---|---|
| 3,056,041 | 9/1962 | Davies | 307/306 |
| 3,500,137 | 3/1970 | Schroen et al. | 307/306 |
| 3,750,153 | 7/1973 | Testardi | 340/173.1 |

OTHER PUBLICATIONS

Farber, et al., High Voltage Tunneling Cryotron Circuit and Structure, IBM Technical Disclosure Bulletin, vol. 9, No. 11, 4/67, pp. 1669-1671.

Weber, New Solid-State Devices and Applications, Electronics, 4/17/59, pp. 39-41.

Primary Examiner—Stuart N. Hecker
Attorney, Agent, or Firm—Harris, Kern, Wallen & Tinsley

[57] ABSTRACT

A superconducting energy storage system comprising storage elements arrayed in a transmission line for receiving, storing, and reproducing charges in the form of current. The system stores charges in potential wells inside elements and moves the charges (representing stored energy) by applying external transfer voltages for moving the potential wells. The energy stored is increased by resonating the storage elements and/or by imparting kinetic energy to the stored charges. The system may be modified to store vortices instead of charges.

13 Claims, 10 Drawing Figures

SUPERCONDUCTING ENERGY SYSTEM

CROSS-REFERENCE TO RELATED APPLICATION

This application is a continuation-in-part of my co-pending application Ser. No. 487,597, filed July 11, 1974, now abandoned, entitled Energy Storage System Using a Superconducting Capacitor.

BACKGROUND OF THE INVENTION

The present invention relates to energy storage systems suitable for use by electric utilities, factories, homes, and car propulsion systems. More particularly, the invention relates to the storage of energy in capacitors and coils suitably refrigerated for operating as superconductors.

Well over 99% of the electricity we use at present is generated at virtually the instant we use it. The rest is channeled into a few cumbersome pumped water storage systems. To keep pace with power demands that fluctuate wildly most utilities operate a multitiered system of generating equipment with newer efficient plants operating continuously and older less efficient plants and gas turbines being called up as needed. Occasionally all this equipment running at full speed cannot satisfy the demand for power. This may happen during peak summer and winter seasons when the demand for electricity exceeds the supply and brownouts occur. By the year 2000 electricity use is expected to double and without storage we can expect widespread power shortages during the hours of the day when demand from industries, offices, homes and factories is at its peak.

A few utilities already store energy by pumping water uphill to a reservoir and then using the downhill fall to generate electricity as needed, water storage being the only practical storage system available. Yet the water system is not efficient; one third of the energy used to pump the water is lost. Other experimental energy storage systems which have been investigated include hydrogen storage, chemical battery storage, compressed air storage, flywheel storage, and superconducting coils. This can all be seen in the article by D. Brand "Scientists Seek Ways of Storing Electricity to Prevent Brownouts" appearing in the July 5, 1974 issue of the Wall Street Journal.

From the discussion above it is clear that although the prior art has the potential it falls short of providing efficient low cost energy storage. The problem is that a moving current cannot be contained in the way that other energy sources, such as coal, oil, or uranium can. Once created, electricity must have somewhere to go. Thus, most experimental energy storage schemes either convert electricity generated at non-peak hours into another substance or use it to perform tasks like spinning a wheel, compressing air, pumping water, charging chemical materials and so forth. This harnessed energy can then be reproduced into electricity at periods of peak demand.

It is a well known physical fact that more energy can be stored in an inductor than in a capacitor. This is true by virtue of the fact that it is relatively easier to generate more flux (maxwells) per ampere in a coil than charge (coulombs) per volt in a capacitor. Typically, coils store one order of magnitude more energy than do capacitors. It is therefore understandable why coils find preference over capacitors in many present storage applications. However, energy storage capacity is not the only consideration for making a selection. The ease, rapidity, and accessibility of storing energy in large capacitors, despite their small energy capacity, is one of the most common and practical ways of storing energy for rapid release. The present invention seeks to preserve the practicality of using a capacitor while at the same time obtaining the benefit of the high energy storage capacity of a coil.

In capacitive energy storage systems, it is necessary to close a switch in the circuit to initiate delivery of energy in the form of current to a load. In contrast, in an inductive energy storage system, it is necessary to interrupt the current in the coil circuit to transfer the current into the load. The problem of repetitively and efficiently opening and closing the switch is non-trivial and must be considered one of the major problems in designing such systems. Furthermore, the energy which can be stored in such systems is limited. Typical storage capacities for electrostatic capacitors is about $10^{-3}$ WH/lb while magnetic coils store about $10^{-2}$ WH/lb (watt-hours/pound). By way of contrast, the lead acid battery stores about 10 WH/lb. This can all be seen in the article by C. J. Lynch "Energy Power Sources" appearing in the October 1967 issue of Science and Technology.

From the foregoing it is clear that coils store more energy than do capacitors but both fall short in practical terms in that the energy which can be stored is rather limited. One way to increase the energy storage capacity of a coil, or of a capacitor for that matter is to refrigerate the device. When this is done the metal becomes superconducting and some of the free electrons become paired together. Large scale superconducting coils have already been manufactured and indeed have achieved energy storage capacities on the order of 0.6 WH/lb. This can be seen in the article by Z. Stekly and R. Thorne "Large-Scale Applications of Superconducting Coils" appearing in the January 1973 issue of the Proceedings IEEE.

The system of the present invention stores energy in the form of electric charge which is contained within the combined electric and magnetic fields of a superconducting capacitor. The superconducting capacitor while operating at low temperature is biased at high voltage to increase its storage energy and may utilize a CCD (charge-coupled device) to obtain ease, rapidity, and accessibility for receiving, storing, and reproducing energy in the form of electric current. The system in accordance with the present invention converts electric current into electrons which can be stored in accurately defined electric and magnetic potential wells in a semiconductor. The wells can be operated in the manner of a familiar shift register moving the aggregates of charge within the semiconductor and reproducing the charge as a current as desired.

It is the purpose of the present invention to produce a high capacity, small size and low cost energy storage system for use in electric utilities, industries, homes, car propulsion systems, and factories.

SUMMARY OF THE INVENTION

This invention provides both apparatus and method for the implementation of a superconducting energy storage system for receiving, storing and reproducing electricity.

The general purpose of this invention is to provide high capacity, small size, and low cost energy storage systems which can be used to implement such diverse systems as electric power plants, industrial, home, and automotive power systems. Utilizing the system of the present invention electric current can be stored and reproduced as desired.

In accordance with a feature of this invention, an apparatus for storing large amounts of potential and kinetic energy in a transmission or delay line is provided. The apparatus comprises a plurality of elements such as current coupled normal or Josephson junctions, charge coupled capacitors, or combinations of inductors and capacitors forming the transmission line. A source current or voltage is used to feed energy into the transmission line in the form of current vortices or charges. A vortice is a closed loop circulating charge. Each vortex or charge travels the length of the transmission line and appears at its output at a later time. The output vortex or charge is recovered as a current and is used to supply a load. The apparatus includes means for operating the system or portions thereof at cryogenic temperatures.

In accordance with another feature of this invention, a means for controlling the travel time of a vortex or charge between input and output of the transmission line can be included. Said means comprises a transfer current or voltage generator for applying transfer currents or voltages to elements of the transmission line for transferring the vortices and charges from element to element through the transmission line.

In accordance with another feature of this invention, the elements of the apparatus can include means for increasing the stored energy by resonating the elements.

In accordance with another feature of this invention, the elements of the apparatus can include means for increasing the stored energy by imparting kinetic energy to the stored vortices and charges.

In accordance with another feature of this invention, the apparatus may comprise a single extended element for performing the transmission line task.

In accordance with another feature of this invention, the apparatus may comprise a serial array of elements for performing the task of a transmission line.

In accordance with another feature of this invention, the apparatus may comprise a planar array of elements for performing the task of a planar parallel bank of transmission lines.

In accordance with a further feature of this invention, the apparatus may comprise a volume array of elements for performing the task of a volume parallel bank of transmission lines.

In accordance with still another feature of this invention, the apparatus can include a computer for accessing the elements of the apparatus and for providing the logic and control functions of receiving, storing, propagating, and recovering energy through the transmission line.

It will be appreciated from the foregoing that the apparatus is uncomplicated and comprises a plurality of one or more elements arranged in a series, planar or volume array and used for the storage of electrical energy for a period of time between its appearance from a source and its consumption in a load. The apparatus includes cryogenic means and may include transfer means for controlling the propagation delay of energy throughputting the device. The apparatus may also include a computer for the logic and control of transferring energy through the device.

In accordance with another feature of the invention, a method for storing large amounts of potential and kinetic energy in a transmission or delay line is provided. The method comprises the steps of: forming a plurality of elements such as normal and Josephson junctions, capacitors, or combinations of inductors and capacitors each for containing a maximum amount of energy; arranging said plurality of elements as members of a transmission line with input, output, and intermediate elements; cooling the transmission line to cryogenic temperatures; generating a source current or voltage; feeding said source current or voltage to said input elements of said transmission line; forming a current vortex or charge in said input elements of said transmission line; propagating said vortex or charge from said input to said output elements of said transmission line; recovering said vortex or charge as a current from said output elements of said transmission line; and using said current from said output elements of said transmission line in a load.

In accordance with another feature of this invention, the method also includes the steps of: generating a transfer current or voltage; applying said transfer current or voltage to elements of said transmission line; forming potential wells in said elements of said transmission line; capturing said vortices or charges in said potential wells; and moving said vortices or charges through said transmission line.

In accordance with another feature of this invention, the method also includes the step of resonating the elements of the apparatus for increasing the stored energy.

In accordance with another feature of this invention, the method also includes the step of imparting kinetic energy to the stored vortices or charges for increasing the stored energy.

In accordance with another feature of this invention, the method includes the step of arranging a single extended element for performing the task of a transmission line.

In accordance with another feature of this invention, the method includes the step of arranging a plurality of elements in a serial array of elements for performing the task of a transmission line.

In accordance with another feature of this invention, the method includes the step of arranging a plurality of elements in a planar array of elements for performing the task of a parallel bank of transmission lines.

In accordance with a further feature of this invention, the method includes the step of arranging a plurality of elements in a volume array of elements for performing the task of a volume parallel bank of transmission lines.

In accordance with yet another feature of this invention, the method also includes the steps of: accessing the elements; and providing the logic and control functions of receiving, storing, propagating, and recovering energy through the transmisson line.

The method may also include the step of using a computer for accessing elements and for providing the logic and control of receiving, storing, propagating, and recovering energy through the transmission line.

A unique feature of the apparatus and method of the invention is the adoption of well known techniques of analog and digital information storage and retrieval more familiar to the computing arts. The difference being that while the computer art is concerned with the storage and movement of information, the present invention is concerned with the storage and movement of energy. By way of analogy, therefore, many of the techniques of the computer art can be used when implementing the invention. For example, the system of the invention can operate as an analog or shift register delay line or as a random access store for storing energy, with or without recirculation of the energy between arrayed elements providing the store, and using the well known techniques of the computer art for accessing, storing, moving and recovering the energy from input to output of the system of the invention.

DESCRIPTION OF THE PREFERRED EMBODIMENTS

Figure 1A:
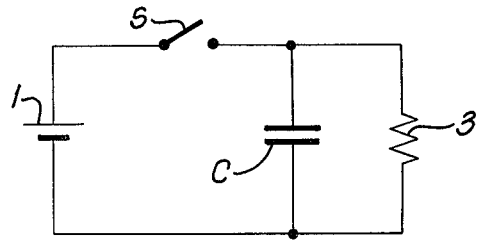
FIG. 1A illustrates a prior art capacitive energy storage system.

Prior to describing the invention, a brief description of the theory of the invention is hereinafter set forth. It is well known that a Josephson junction supports a supercurrent; that the maximum value of the supercurrent is a function of the characteristics of the superconductors used in the junction and the insulator or barrier thickness; that an externally applied magnetic field (or its equivalent electrical current) will destroy the superconductivity; that junctions can be made in a variety of forms, for example thin film tunnel junctions, point contact junctions, extended area junctions, and thin film bridge junctions; that junctions can be made using a variety of superconductors, for example type I and type II superconductors; that type II superconductors have a high current capacity; that each junction can be characterized by a lumped circuit model having Josephson, capacitive, inductive, and conductive coupling energies; that the Josephson, capacitive, inductive and conductive coupling energies in a junction can be designed as desired through the use of substrate materials, proximity planes, and ground planes; that application of an external voltage to the junction can be used to store energy (capacitive coupling); that application of an external current (or equivalent field) to the junction can be used to store energy (inductive and Josephson coupling); that storing energy in the junction is dissipationless provided the superconductivity persists; that application of an external current to an extended junction whose extension is greater than the Josephson penetration depth can be used to create a vortex; that a vortex represents stored energy; that a vortex can be propagated in a junction or can be shifted between junctions through application of external currents to the junction(s); that application of external currents can be used to form potential wells in junctions; that energy can be captured and guided in potential wells created by currents applied to the junction(s); that kinetic energy can be imparted to vortices by applying external currents to the junction(s); that junctions can be arrayed to form delay lines or shift registers, for example for use in computers; and that arrayed junctions can be accessed serially, for example as shift registers, or random access, for example as random access memories in computers. This is all well known and appreciated and can be seen in a number of publications including the papers by J. Gunn "Preface", L. Esaki, "Long Journey into Tunneling", I. Giaver "Electron Tunneling and Superconductivity", and B. Josephson "The Discovery of Tunneling Supercurrents" all appearing in the June, 1974 issue of Proceedings of the IEEE, in the special issue on Applications of Superconductivity of the January, 1973 Proceedings of the IEEE, and in the books by L. Solymar, "Superconductive Tunneling and Applications" Wiley-Interscience, 1972, D. Fishlock, ed., "A Guide to Superconductivity" American Elsevier, 1969, J. Williams, "Superconductivity and its Applications" Pion Ltd, London NW2, 1970, and S. Foner and B. Schwartz, eds., "Superconducting Machines and Devices" Plenum Press, 1974.

Moreover, it is equally well known that semiconductors support positive and negative mobile electric charges; that the charges can be stored in a capacitor storage element having the semiconductor and an insulator sandwiched between metal plates; that the charge can be moved to a similar adjacent capacitor by the external manipulation of voltages; that the quantity of stored charge can vary widely, depending on the applied voltages and on the capacitance of the storage element; that the maximum value of the stored charge is a function of the dielectric strength of the insulator; that an externally applied electric field will increase the charge storage capacity; that capacitors can be made in a variety of geometrical forms, for example flat plate and concentric plate (cable) capacitors; that semiconductors used in capacitors can be made using a variety of superconductors, for example type I and type II superconductors; that type II superconductors have a high current capacity; that a capacitor storage element can be characterized by a lumped circuit model having capacitive, Josephson, inductive, and conductive coupling energies; that the capacitive, Josephson, inductive, and conductive coupling energies in a capacitor storage element can be designed as desired through the use of well known superconducting plate, insulator and semiconductor materials and having a variety of geometrical forms; that application of an external voltage to the capacitor can be used to store energy (capacitive coupling); that application of an external current (or equivalent field) to the capacitor can be used to store energy (inductive coupling); that storing energy in the capacitor is dissipationless provided the superconductivity persists; that application of an external charge to a semiconductor in a capacitor can be used to store energy; that the charge can be propagated in the capacitor or can be shifted between capacitors through application of external voltages to the capacitor(s); that application of external voltages can be used to form potential wells in capacitors; that energy can be captured and guided in potential wells created by voltages and currents applied to the capacitor(s); that kinetic energy can be imparted to charges by applying external voltges to the capacitor(s); that capacitors can be arrayed to form delay lines or shift registers, for example for use in computers; and that arrayed capacitors can be accessed serially, for example as shift registers, or random access, for example as random access memories in computers. This is all well known and appreciated and can be seen in a number of publications including the papers by G. F. Amelio "Charge Coupled Devices" appearing in the May, 1974 issue of Scientific American, W. S. Boyle and G. E. Smith "Charge Coupled Semiconductor Devices" and G. F. Amelio et al., "Experimental Verification of the Charge Coupled Device Concept" both appearing in the April, 1970 issue of the Bell System Technical Journal, Paper No. 2 "Introduction to Charge-Coupled Devices" presented at the IEEE Western Electronic Show and Convention (WESCON) Los Angeles, Sept. 10-13, 1974, W. F. Kosonocky and D. J. Sauer "The ABCs of CCDs" appearing in the April 12, 1975 issue of Electronic Deisgn, and (for superconductivity) in the foregoing references by J. Gunn, L. Esaki, I. Giaver, B. Josephson, L. Solymar, D. Fishlock, J. Williams, and S. Foner and B. Schwartz.

It will be appreciated from the foregoing theory that an appropriate selection of well known superconducting materials in a Josephson junction, thin or thick barrier (normal) junction, capacitor or combination inductor-capacitor can be used to maximize the potential energy which can be stored in the junction or capacitor and to maximize the kinetic energy imparted to or taken from a vortex or charge passing the junction or capacitor; that a plurality of such junctions or capacitors can be used to store a large amount of potential and kinetic energy; that the junctions or capacitors can be arrayed as serial, parallel, or volume arrays as desired, for example forming a parallel plate or cable transmission line, delay line, serial access shift register or random access memory store; that access to individual members of arrayed junctions or capacitors can be made using well known computer techniques, for example accessing a random access memory; that voltage or current inputs can be stored in the form of charges or vortices and these can be propagated between input and output and can be recovered as voltages and currents for use in a load at a later time; that the propagation of charges or vortices in the arrayed junctions or capacitors can be guided from input to output through application of external transfer voltages or currents (or their equivalent fields); that application of external transfer voltages or currents to the individual arrayed junctions or capacitors can be used to form potential wells; that potential wells can be used to store energy; that large kinetic energies can be imparted to the stored charges and vortices by applying voltages or currents to the arrayed junctions or capacitors for accelerating the charges and vortices; and that large kinetic energies can be extracted from the stored charges and vortices by applying opposing voltages or currents to the arrayed junctions or capacitors for decelerating the charges and vortices.

In general, the apparatus of the invention comprises a plurality of Josephson junctions, thin or thick barriers, i.e., normal junctions, capacitors, or combinations of inductors and capacitors, hereinafter referred to as elements. Each element can include means for storing a maximum amount of energy. The elements can be connected in series forming serial-in serial-out delay lines. The delay lines can be connected in parallel forming a planar array of elements and thereby permitting the parallel-in parallel-out throughputting of energy. The delay lines can also be connected in parallel forming a volume array of elements and thereby permitting a higher degree of paralleling or the throughput of energy. Refrigeration means are used for cooling the elements or portions thereof to cryogenic temperatures. A source voltage or current, for example such as may be obtained from an electric utility, nuclear powerplant, or solar cell generator can be used to feed energy to the delay line. The source voltage or current when applied to the first element of the delay line forms a vortex or charge and its continuous application forms a series of vortices or charges with succeeding vortices or charges pushing or propagating preceeding vortices or charges through the delay line. A given vortex or charge travels the length of the delay line and is recovered as a current or voltage for use in a load at its output. Transfer currents or voltages can be utilized in the individual elements forming the delay line to transfer vortices or charges from element to element, to hold vortices or charges in place, or to impart or extract kinetic energy to the vortices or charges as desired. Access to a given element can be obtained using the logic and control of a computer as desired, for example the access can be serial or random access and follows the well known teachings of the computer art. Thus, in serial access, a first-in vortex or charge at the delay line input appears as a first-out vortex or charge at its output while in random access a vortex or charge can be stored in a given element and removed at a later time as desired, i.e., with the desired propagation delay between input and output of the delay line. More specifically, the apparatus of the invention comprises a plurality of elements for storing energy in the form of vortices or charges, said elements comprising any one of a Josephson junction, normal junction, charge coupled capacitors, or combination of inductors and capacitors, said elements connected in serial, planar, or volume arrays and with refrigeration means for cooling said elements or portions thereof to cryogenic temperatures, a source of energy such as a voltage or current source connected to said elements for feeding energy to said system, and a load connected to said elements for consuming energy provided by the system. The arrayed elements may operate in the dissipationless mode or with dissipation as desired. The apparatus can include transfer means for guiding or transferring vortices or charges from input to output and can include computer means for accessing elements and for providing the logical control of the propagation of vortices or charges from input to output and between the individual elements.

In general, the method of the invention comprises the steps of forming and arraying a plurality of elements, cooling the elements, generating a source current or voltage and using same to form and propagate a vortex or charge in the arrayed elements, and to recover and use the vortex or charge as a current or voltage in a load at the system output. More specifically, the method of the invention comprises the steps of: forming a plurality of elements, each for containing a large amount of energy; connecting said plurality of elements as elements of a delay line with input, output, and intermediate elements; cooling elements or portions thereof to cryogenic temperatures; generating a source voltage or current; feeding said source current or voltage to said input elements of said delay line; forming a vortex or charge in each of said input elements of said delay line; propagating said vortex or charge from said input to said output elements of said delay line through selected ones of said intermediate elements of said delay line; recovering said vortex or charge as a current or voltage from said output elements of said delay line; and using said recovered current or voltage in a load.

The method of the invention can be modified by applying external transfer currents or voltages (or their equivalent fields) to individual elements of said delay line for transferring said vortices or charges from element to element of said delay line or for capturing, holding, guiding, accelerating or decelerating the propagation of said vortex or charge through said delay line. More specifically, the method of the invention can be modified by including the steps of: generating a transfer current or voltage; applying said transfer current or voltage to any one or more elements of said delay line; forming potential wells in said elements of said delay line; capturing said vortices or charges in said potential wells; and guiding the propagation of said vortices and charges from element to element of said delay line.

The method of the invention can also be modified by including the step of resonating said elements and/or the step of imparting kinetic energy to said vortices and charges. The method of the invention can be further modified by automating the accessing of said delay line by using a computer, for example by including means for shifting said delay line as a shift register or for randomly accessing said delay line as a random access memory, said means being well known in the computer art. More specifically, the method of the invention can be modified by the step of accessing each element of said delay line by a computer as one of a serial, parallel or random access.

FIG. 1A illustrates the manner in which a prior art capacitive energy storage system works. A power source 1 is used to charge a capacitor C and load 3 in parallel through switch S. The load 3 is generally a high-impedance element and the cycle begins by closing the switch S and charging the capacitor C. When a given charge is achieved, the switch S opens and the capacitor C discharges through the load 3. The energy stored in capacitor C is dumped into the load 3.

Figure 1B:
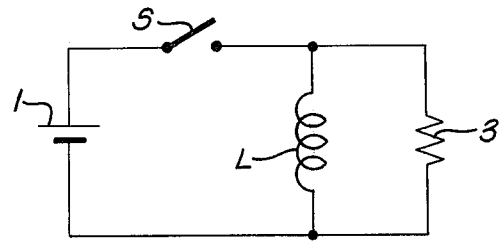
FIG. 1B illustrates a prior art inductive energy storage system.

FIG. 1B illustrates the manner in which a prior art inductive energy storage system operates. The cycle begins by closing the switch S and charging the inductor L. When a given current level is achieved, the switch S opens and the inductor L discharges through the load 3. The energy stored in the inductor is dumped into the load 3.

Figure 1D:
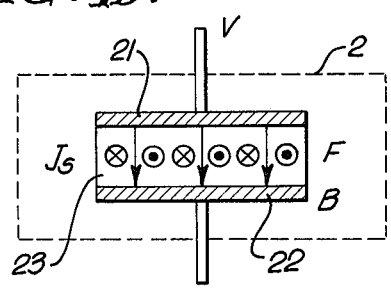
FIG. 1D illustrates a superconducting energy storage system in accordance with the system of the present invention.
Figure 1C:
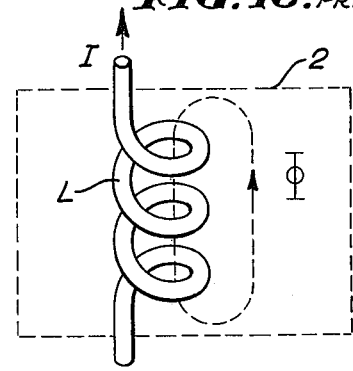
FIG. 1C illustrates a prior art superconducting inductive energy storage system.

FIG. 1C illustrates how a prior art superconducting coil works. The coil is enclosed in a vacuum-insulated cryogenic container 2. When the switch S closes, the current I in the coil L creates the flux $\Phi$. The superconducting feature of FIG. 1C enables the coil to operate at a higher current density and thereby to store several orders of magnitude more energy than the non-superconducting coil of FIG. 1B. This is essentially the system of the reference by Z. Stekly and R. Thorne FIG. 1D illustrates how a superconducting capacitor works in accordance with the system of the present invention. It will be appreciated by those in the art that the equivalent circuit model of FIG. 1D comprises an inductor in series with a parallel combination of a capacitor and a conductor; that the equivalent circuit can be resonated through proper engineering design or by providing another means, for example the coil of FIG. 1C, in series with the capacitor of FIG. 1D to form a resonating element as desired. The capacitor consists of an insulator 23 inserted between two superconductors 21 and 22 which are enclosed in a vacuum-insulated cryogenic container 2. When the voltage V is applied it creates the electric field density F which can be used to store energy in the capacitor (capacitive coupling). A current I flows which creates the magnetic flux density B which can also be used to store energy in the capacitor (Josephson and magnetic coupling). Moreover, the storage of energy is practically dissipationless provided the superconductivity persists. Shown in FIG. 1D are a number of flux linkages accompanying currents passing between the metal plates 21 and 22; the crosses indicate flux going into the plane of the figure and the dots indicate flux emerging from the plane of the figure. Thus, while all that is necessary to increase the energy storage of the coil of FIG. 1C is to operate the coil as a superconducting coil, increasing the energy storage of the capacitor of FIG. 1D requires operating the capacitor as a superconducting capacitor and, in addition, resonating the capacitor either by using its internal distributed inductance or by adding an external inductance.

The potential energies of the electric and magnetic fields in the capacitor or junction of FIG. 1D are given, respectively, by $$E = \frac{1}{2} c V^2 A \quad (1)$$
electric coupling $$E = \frac{1}{2l l^2} A_c + \Phi_o J_c A_c \cos\left(\frac{ll A_c}{\Phi_o}\right) \quad (2)$$
magnetic and Josephson coupling where $c = \epsilon/d$ is the capacitance per unit area, $\epsilon$ is the permittivity of insulator 23, $d$ is the separation between superconductors 21 and 22 $V$ is the externally applied voltage, $A = ab$ (length $\times$ width) is the area of the capacitor or junction, $l = \mu d/b^2$ is the inductance per unit area, $\mu$ is the permeability of insulator 23, $I$ is the current, $\Phi_o = 2 \times 10^{-15}$ $Wb$ is the flux quantum, $J_c$ is the critical current density, and $A_c \leq A$ is the area of the capacitor or junction in which supercurrent flows ($A_c = A$ when the length $a$ of the capacitor or junction is smaller than the Josephson penetration depth $\lambda_J$). The critical current density $J_c$ is the maximum current per unit of cross section that a superconductive material can carry and still retain its superconductivity.

It will be appreciated by those skilled in the art that two types of superconductors are known in practice. In type I the superconductivity vanishes on exposure to relatively low magnetic fields, for example usually only a few hundred Gauss. But type II superconductors possess two critical fields, $H_{c_1}$ and $H_{c_2}$ and although $H_{c_1}$ is also low, $H_{c_2}$ can be very high indeed. Type II superconductors, in accordance with the system of the present invention, fulfill the requirement for high energy storage, since superconductivity persists in the presence of high fields (or their equivalent currents). Thus, by specifying superconductors 21 and 22 as type II superconductors, the present invention insures that a high supercurrent density $J_s$ becomes available and, in view of equation (2), a large magnetic and Josephson coupling energy can be stored in a junction. Typical curves of the supercurrent density $J_s$ versus the magnetic field H for some well known superconductors, for example Nb$_3$Sn, Nb-48% Ti and Nb-25%Zr as shown at page 24 in the reference by D. Fishlock, show values of J$_s$ between 10$^9$ and 10$^{10}$ A/m$^2$. Any one of these superconductors therefore can be used when implementing superconductors 21 and 22 in FIG. 1D. The general state of the art of superconductors can be seen in the references by Z. Stekly and R. Thorne, in chapter 2 of the reference by D. Fishlock, and in chapter 2 of the reference by S. Foner and B. Schwartz. Thus, assuming a value $J_s = 10^{10}$ A/m$^2$ it can be seen, using equation (2), that a dissipationless junction is capable of storing $2 \times 10^{-5}$ J/m$^2$ of energy (Josephson and magnetic coupling). By way of comparison, assuming a typical $\epsilon/d$ of $10^{-1}$ F/m$^2$ and a superconducting energy gap $\Delta = 10^{-2}$eV, the dissipationless junction can store, using equation (1), about $2 \times 10^{-5}$ J/m$^2$ (capacitive coupling), since the application of a voltage V in excess of $2\Delta/e$ destroys the superconductivity and makes the junction dissipative. The dissipationless junction is capable of storing energy in both capacitive, Josephson and magnetic coupling. However, to preserve the dissipationless junction, the capacitive and magnetic coupling energies are restricted to upper bounds for the values of the applied voltage V and current I which can be used. While the dissipationless junction is obviously a preferred one since no energy is lost in the junction, the dissipating junction is not without merit and can be utilized equally well in the system of the present invention. In exchange for accepting a small energy loss, the junction can be made to operate at much higher voltage and current levels; in fact the voltage and current can be increased right up to the breakdown of insulator 23. In general superconducting devices are economic only if the reduced power dissipation in the device itself is sufficient to compensate for the power requirements of the refrigerator plant. Even then the capital cost of a superconducting device may be so large as to preclude its replacing a conventional device so that a net reduction of the power dissipation is needed. The system of the present invention provides just such a net reduction of the power dissipation and thereby opens the range of application for such devices. In the foregoing, the term dissipationless is used to indicate the voltage V never exceeds the limit $2\Delta/e$ where $\Delta$ is the energy gap of insulator 23 and e is the electron charge and, for which case, the current I never exceeds the critical current $I_c = J_cA_c$. The term dissipating, on the other hand, is used to indicate the applied voltage V exceeding $2\Delta/e$ and therefore current I exceeding $I_c$. Whether dissipationless or dissipating, the superconducting feature of FIG. 1D enables the capacitor not only to store several orders of magnitude more energy than the simple capacitor of FIG. 1A but also to store several orders of magnitude more energy than the simple coil of FIG. 1B and indeed, as we shall see, several orders of magnitude more energy than the superconducting coil of FIG. 1C. This is true by virtue of the fact that the superconducting feature, i.e., superconductors which operate at cryogenic temperatures, can carry heavy currents with little resistance loss. As a result, the wires and the system itself can be smaller than with conventional systems. And, more importantly, the systems can operate with improved efficiencies. These features will be explained more fully later. The capacitor of FIG. 1D is one embodiment of the system of the present invention.

The capacitor of FIG. 1D can be used in any one of a number of ways, for example as a direct substitute for the simple capacitor of FIG. 1A. However, this arrangement has several drawbacks; as previously noted the switching is nontrivial and, in addition, the ease, rapidity and accessibility of storing energy in this manner is not fully realized. The capacitor of FIG. 1D can also be used in a series or parallel combination with the coil of FIG. 1C forming a resonating element.

It will be appreciated by those skilled in the art that a plurality of elements, as shown in FIG. 1D, can be arrayed to form a series of elements, a planar array of elements, and a volume array of elements and that well known computer means can be used to access elements in a variety of ways, for example following the computer art wherein memory elements are routinely arrayed to form a variety of logical, arithmetic, and memory functions, and input and output functions such as shift registers and random access memories for the storage and movement of information bits. The present invention postulates like techniques using serial, planar, and volume arrays of elements for storage and movement of energy bits in the form of charges and vortices. Therefore, the elements of the invention can be arrayed to operate using the well known techniques of accessing in the computer art; the difference being that while arrayed elements of the computer art carry information bits having miniscule energy content, the arrayed elements of the present invention carry energy bits having large energy content. Accordingly, in order for the elements of the present invention to operate, they generally must be arrayed in an array of some kind, similar to arrays well known in the computer art but with elements specified by the invention, and with accessing means for accessing the arrayed elements. However, since the arraying of elements and the associated techniques of their accessing and the movement of information bits from element to element are all well known in the computing arts, they will not be further illustrated here but it will be assumed that the arraying and accessing of elements, as shown in FIG. 1D, and the movement of energy bits from element to element in such arrayed elements is possible following the teachings of the computer art; the difference being that while the computer art is concerned with the logical storage and movement of information bits the present invention is concerned with the logical storage and movement of energy bits.

Figure 2:
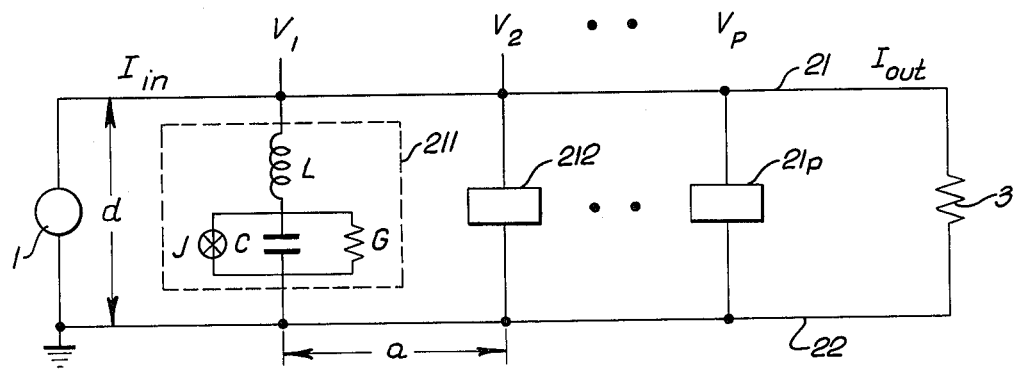
FIG. 2 illustrates a lumped circuit model of $p$ elements forming a transmission line embodiment of the system of the present invention.

When fabricated as a transmission line of electrical energy by superconducting cables the invention might look as shown in FIG. 2 which illustrates $p$ like elements 21$p$, where $p = 1, 2, \ldots$, arrayed across a prior art superconducting transmission line. Thus, each element 21$p$ consists of an inductance L in series with a parallel combination of a Josephson junction J, capacitor C, and conductance G. The separation of elements is $a$, while the height of an element, or the separation of superconductors 21 and 22, is $d$. It will be appreciated by those skilled in the art that the Josephson junction J is included only when the voltage V applied to superconductors 21 and 22 does not exceed the gap voltage $\Delta/e$ ($\Delta$ energy gap, $e$ = electron charge). Elements 21$p$ may operate above or below the gap voltage $\Delta/e$, i.e., with or without the Josephson effect. In general, therefore, the inductance L and capacitance C may be actual lumped circuits, for example the superconducting coil of FIG. 1C in series with the superconducting capacitor of FIG. 1D or may be distributed circuits, for example Josephson junctions (metal 21 - insulator 23 - metal 22) or extended capacitors (metal 21 - dielectric 23 - metal 22) having distributed inductance $l = L/A$, capacitance $c = C/A$, and conductance $g = G/A$ per unit area where $A$ is the area of the element, i.e., $A = ab$ ($a$ = length of element, $b$ = width of element).

It will be appreciated by those skilled in the art that the transmission of electrical energy from an energy source 1 to a load 3 is possible by superconducting cables 21 and 22, for example as suggested in the reference by S. Foner and B. Schwartz; that when selecting superconductors 21 and 22 for a direct current (dc) cable, three aspects are of importance, first, a high critical current density at low flux density is needed so that the superconducting material required and the dimensions of the conductor can be kept low, second, a high transition temperature is desired so that the cable can be operated at the highest possible temperature where the efficiency of helium refrigeration plants is better and, third, cost. For these reasons high field superconductors are primarily suitable for use as dc cable superconductors, namely the alloys NbTi and NbZr and also the compounds $Nb_3Sn$ and $V_3Ga$. For economic reasons pure niobium is preferred. Moreover, alternating current (ac) hysteresis losses dictate the use of niobium and $Nb_3Sn$. On the other hand, when elements 21p are in distributed form these may comprise any one of a vacuum, helium (liquid, subcooled liquid or supercritical) or wound foil insulation impregnated with helium or foil insulation in vacuum, all insulators 23 (collectively in elements 21p) being well known in the prior art. Accordingly, in FIG. 2, superconductors 21 and 22 can be specified using niobium while dielectric 23 can be specified using a vacuum. While not shown in the figure, the niobium can be backed by a stabilizing metal, for example copper, as is well known in the prior art.

Figure 3A:
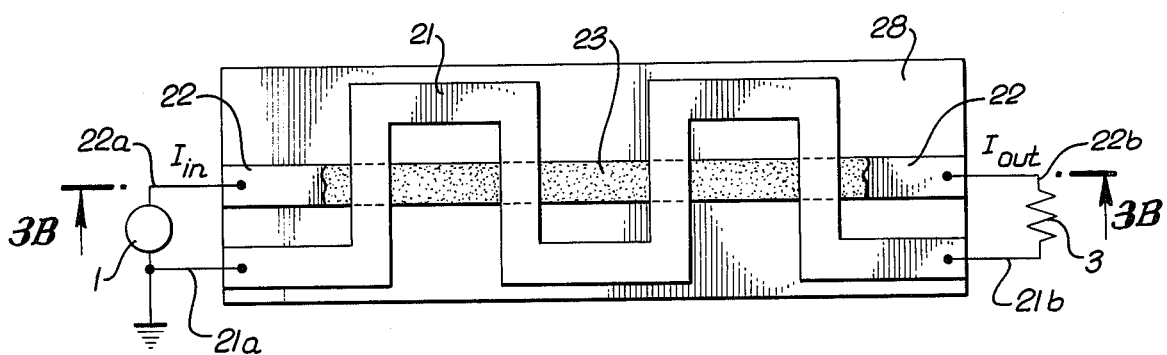
FIG. 3A shows a preferred embodiment of the invention as a thin film shift register using current coupled normal or Josephson junctions for storing energy in the form of current vortices.

When fabricated as a transmission line of electrical energy by superconducting thin barriers the invention might look as shown in FIG. 3A which illustrates a planar view of a serial array of Josephson junctions. The two long evaporated strips 21 and 22 which form tunnel junctions at their intersections are vapor deposited on a glass substrate 28. As soon as the superconductor 22 strip is exposed to air a protective insulating oxide 23 forms on its surface. The thickness of the oxide 23 depends on such factors as time, temperature, and humidity. After a suitable oxide has formed meandering superconductor 21 is evaporated over the first film of superconductor 22 and thereby sandwiching the oxide 23 between superconductors 21 and 22. Leads 21a, 21b and 22a, 22b are provided connecting a power source 1 and load 3 to the system as shown. It will be recognized by those in the art that the fabrication just described by way of example follows well established thin film practices with two words of caution being, first, the forming of a uniform oxide 23 free of microshort defects as is well known in the superconducting thin film art and, second, a high-energy junction is specified for the present invention as opposed to the well known small energy junctions of the present superconducting thin film art. Moreover, it is a matter of design choice to form insulating oxide 23 as suggested or, alternatively to vapor deposit some other suitable oxide such as silicon oxide. A superconducting ground plane (not shown in FIG. 3A) can be used below glass 28 or replacing same but insulated from superconductors 21 and 22, to modify, change, increase, or reduce, the distributed capacitance and inductance of junctions. A normal metal overlay or underlay (not shown) bridging the two superconductors 21 and 22 may be utilized to provide the desired damping, i.e., for preventing the overshoot of vortices or charges from wells at designated junction locations.

Figure 3B:
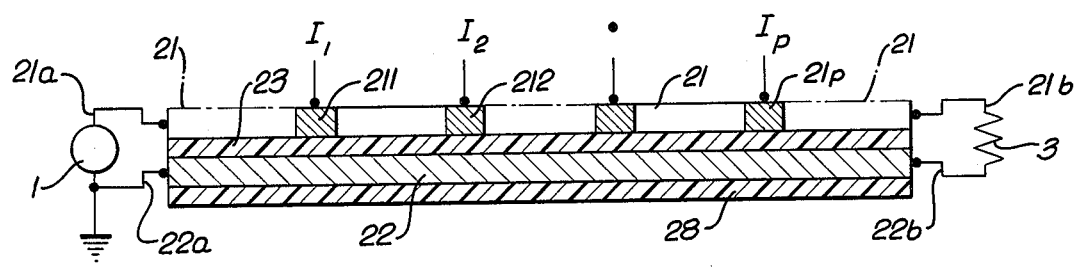
FIG. 3B shows a cross section of the system of FIG. 3A through section A—A.

Shown in FIG. 3B is a cross section along A—A of the system of FIG. 3A showing the serial array of junctions 211-21p. Transfer currents $I_1 - I_p$ may be applied to the individual junctions 211 - 21p.

Figure 3C:
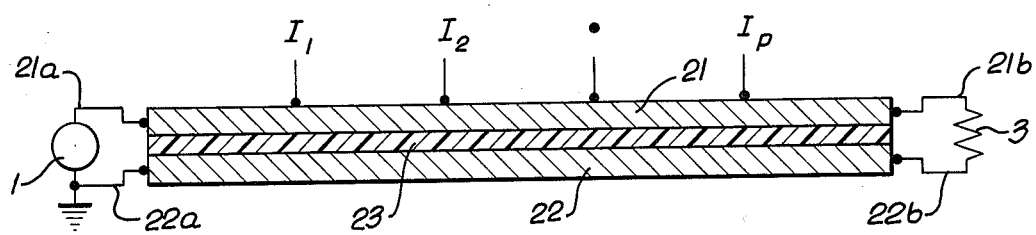
FIG. 3C shows an alternate embodiment of the system of FIG. 3A.

An alternate design of the system, shown in FIG. 3C, uses an extended junction with a uniform critical current density $J_c$ and operates as a fixed time delay line or shift register as do the embodiments of FIGS. 2 and 3A. The difference between the systems of FIGS. 3A, 3B and FIG. 3C is the meander superconductor 21 in the former now implemented as a straight line strip in the latter. The spacing of transfer currents $I_1 - I_p$ in FIG. 3C is determined by such characteristics as the capacitive and inductive couplings between the junctions. Otherwise, the systems of FIGS. 3A, 3B and FIG. 3C operate in a like manner.

Application of a voltage $V_{in}$ or current $I_{in}$, for example a voltage or current which originates in a source 1, to the first element 211 in the array of elements 21p creates an energy storage in the form of a charge (magnetic and capacitive coupling in FIG. 2) or in the form of a vortex (Josephson and magnetic coupling in FIG. 3) for this element. The Josephson, magnetic, and capacitive coupling energy is obtained by combining equations (1) and (2). The Josephson coupling is excluded when the system operates at a voltage level above the gap voltage $\Delta/e$, for example operating the system of FIG. 2 at a high voltage level. Once formed, a charge or vortex will stay put in element 211 unless displaced to the next adjacent element 212 by the formation of a second charge or vortex now occupying the just vacated location of element 211 and resulting from the continued application of source voltage $V_{in}$ or $I_{in}$ to input element 211. Thus, the continuous application of a source voltage $V_{in}$ or current $I_{in}$ to the input element 211 results in the accumulation or charging of the system, i.e., the storage and propagation of energy in the array of elements 21p with each element storing its charge or vortex having energy given by equations (1) and (2). A charge or vortex appears at the output element 21p with time delay, i.e., at a later time from its creation by a source voltage $V_{in}$ or current $I_{in}$ at the input element 211. The systems of FIGS. 2 and 3 therefore form transmission or delay lines, i.e., in which a charge or vortex once introduced at the system input appears at the system output following a fixed delay in time. The load voltage $V_{out}$ or current $I_{out}$ appearing at the output of element 21p can be used in a load 3.

Alteratively, the time delay of charges and vortices between the input and output of the systems of FIGS. 2 and 3 can be controlled by operating these systems as shift registers. In this configuration, transfer voltages $V_1 - V_p$ or currents $I_1 - I_p$ are applied to elements 211 - 21p. Transfer voltages $V_1 - V_p$ or currents $I_1 - I_p$ can be obtained from source 1 along with source voltage $V_{in}$ or current $I_{in}$ or, alternatively, may be obtained from an independent source. The application of a transfer voltage or current to an element occupied by a charge or vortex pushes the charge or vortex to an adjacent unoccupied element location with the sign of the applied transfer voltage or current determining the shift-right or shift-left maneuver. It follows that the application of transfer voltages $V_1 - V_p$ or currents $I_1 - I_p$ to elements 211 - 21p in a given logical pattern or sequence will have the effect of moving the charges or vortices from their present locations to other desired locations in the array of elements. Clearly, in actual operation, several such shifting processes would be carried out simultaneously at selected elements $21p$ in the systems of FIGS. 2 and 3. For example, voltage or current pulses could be applied alternately to every other element, with all even (odd) numbered elements being empty at one moment, awaiting the transfer of the contents of adjacent elements upstream or prior in time, i.e., odd (even) elements to transfer their contents into them in the next cycle. The creation and control of transfer voltages $V_1 - V_p$ or currents $I_1 - I_p$, i.e., the formation of their patterns and time sequences for storing and moving energy from source 1 to load 3, is a straightforward logic and control problem and can be easily accomplished by a computer. Accordingly, in order that the system of the invention can operate as a controllable energy storage device, for example as a shift register, it must be logically controlled by a computer of some kind, i.e., the source of transfer voltages $V_1 - V_p$ or currents $I_1 - I_p$ must be programmed to provide the desired patterns and time sequences of transfer voltages $V_1 - V_p$ or currents $I_1 - I_p$. However, since the generation of voltages and currents and the control thereof using computers is well known in the power generation and control arts, they will not be further illustrated here but it will be assumed that the generation of transfer voltages V or currents I (dc or ac) and their patterning and sequencing using a computer is possible following the teachings of the power generation and control arts and that, therefore, the logical control of the energy in accordance with the system of the present invention is possible.

It will be appreciated by those skilled in the art that an applied positive or negative voltage V or current I to an element containing a charge or vortex in the array of elements will produce a force on the charge or vortex in the plus or minus (forward or backward) direction. It follows that application of a transfer voltage $V_x$ or current $I_x$ at location $x$, where $x = 1, 2, \ldots, p$, and another transfer voltage $V_{x+1}$ or current $I_{x+1}$ at location $x + 1$ forms a potential well (field) for the charge or vortex in the region between the two elements at $x$ and $x + 1$. In principle, the position of these potential wells could be moved steadily along the arrayed elements and any charge or vortex contained in the well would be carried with it. One can envision, therefore, a version of the system of the present invention employing a series of such moving potential wells for moving a pattern of associated charges or vortices through the delay line. The potential wells would be formed by the applied transfer voltages and currents and these, in turn, would be programmed by a computer.

From the foregoing it can be seen that a charge or vortex, once created, at the input element 211 will propagate through elements 211 - $21p$ to output element $21p$ at a given speed as desired; that continuous application of input voltage $V_{in}$ or current $I_{in}$ will push the initial charge or vortex through the system when no transfer voltages $V_1 - V_p$ or currents $I_1 - I_p$ are applied; that application of transfer voltages $V_1 - V_p$ or currents $I_1 - I_p$ to the elements 211 - $21p$ will cause the charge or vortex to stop, accelerate, gain or lose kinetic energy; that the total kinetic energy of the charge or vortex can be progressively increased to energy pE, where E is the energy imparted per element, by passing it successively through $p$ elements. Thus, application of transfer voltages $V_1 - V_p$ or currents $I_1 - I_p$ to elements in a p-element delay line can be used to produce the kinetic energy pE. Moreover, it will be appreciated by those skilled in the art, that the kinetic energy per element pE exceeds the potential energy per element E by the multiplying factor p, i.e., by the total number of elements providing the individual accelerations. Likewise, decoupling energy can be accomplished by reversing the transfer voltages and currents and passing the charges or vortices through elements having such reversed transfer voltages or currents.

In general, the forming of elements 211 - $21p$, for example comprising superconducting coils, capacitors and Josephson junctions, the formation of charges and vortices in said elements, and the movement of charges and vortices in delay lines and shift registers are well known in the superconducting arts and when used in combination with the teachings of the present invention form improved energy storage means. Thus, the formation of elements 211 - $21p$ for storing energy, the creation and movement of charges or vortices in delay lines and shift registers can be directly adopted from the prior art to the present invention; the difference being that while the prior art is concerned with the storage and movement of information bits, the present invention is concerned with the storage and movement of energy bits. The term energy bit is used to denote the energy stored in a given element $21p$.

Figure 4:
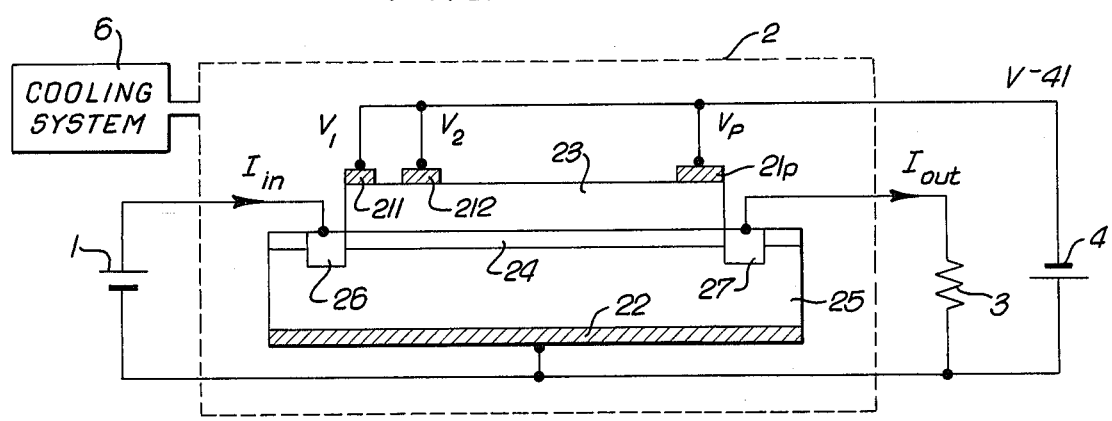
FIG. 4 shows a preferred embodiment of the invention as a shift register using charge coupled elements for storing energy in the form of charges.

FIG. 4 illustrates a preferred embodiment of the invention which bypasses the switching problem and provides easy, rapid, and accessible energy storage. A power source 1 is used to provide a current $I_{in}$ and a transfer source 4 is used to provide transfer voltages $V_1 - V_p$ to elements 211 - $21p$ where $p = 1, 2, \ldots$. In operation, the current $I_{in}$ is used to charge element 211, i.e., for increasing its potential and kinetic energy content. Transfer voltages $V_1 - V_p$ are used to transfer the energy from the input diode 26 to the output diode 27. FIG. 4 is shown in the form of a charge coupled shift register, for example as suggested in the reference by G. F. Amelio; the difference being the maximization of the potential and kinetic energy stored in the system and cryogenic operation to reduce power losses and to reduce the size of the apparatus. Superconductors 21 (collectively 211 - $21p$) and 22 may be specified as a metal, for example niobium, while insulator 23 may be specified as a dielectric, for example a vacuum. Semiconductors 24 and 25 may be specified as high carrier concentration superconducting semiconductors, for example lead telluride (PbTe). Diodes 26 and 27 may be specified as a metal, for example aluminum.

It will be appreciated by those in the art that charge coupled devices (CCDs) can be constructed as surface channel devices (SCCDs) or as buried channel devices (BCCDs), for example as suggested in the reference by W. F. Kosonocky and D. J. Sauer; that when constructed as a SCCD both semiconductors 24 and 25 are specified as p-type; that when constructed as a BCCD semiconductor 24 is specified as n-type while semiconductor 25 is specified as p-type; that potential wells of a SCCD are formed at the dielectric 23 - semiconductor 24 interface; that, in contrast, the BCCD forms potential wells below the semiconductor 24 interface to avoid charge trapping by surface states. Thus, by way of example, FIG. 4 illustrates a BCCD wherein the conductivity of semiconductor 24 is opposite to that of semiconductor 25. Diodes 26 and 27 are used to receive the input current $I_{in}$ from power source 1 and to provide the output current $I_{out}$ to load 3. Superconducting elements 211 - $21p$ or selected portions thereof may be isolated thermally and connected to a cooling, refrigeration, or vacuum-insulated cryogenic container system 6 for cryogenic operation. Thus, the devices of the invention are operated at a temperature below the transition temperature of the superconductive material used. Accordingly, in order for the devices to operate they must be contained in a cryogenic refrigerator 2 of some kind. However, since this type of apparatus is well known in the art, it will not be further illustrated, and in the detailed description of the operation of the devices of the invention, it is assumed that the elements 211–21$p$ or selected portions thereof are in such a low temperature environment that superconductivity is possible.

Superconductors 21 and 22 may be any one of a number of types such as aluminum, copper, lead, superconducting intermetallic compounds such as $Nb_3Sn$, $V_3Ga$, $Nb_3(Al_{0.8}Ge_{0.2})$, $Nb_3Al$, superconducting alloys such as Nb-48Ti, and so forth. Insulator 23 may be any one of a number of types such as a vacuum, helium, silicon oxide, superconducting metallic oxides, superconducting alloy oxides, and so forth. Semiconductors 24 and 25 may be any one of a number of types of superconducting semiconductors, for example those listed at page 342 in the reference by L. Solymar. Semiconductors 24 and 25 may be n-type or p-type for depletion or enhancement of their carriers as desired, for example lead telluride or silicon oxide. By way of example, superconductors 21 (collectively 211 – 21$p$), 22 can be made of niobium (Nb). The niobium can be backed by a conductor which while lossy is not too lossy, for example pure aluminum. The aluminum backing acts as a stabilizer to the niobium and also absorbs overloads.

For a significant energy transfer, there must be a high current flow in semiconductors 24 and 25 as well as a high voltage between superconductors 211 – 21$p$ and superconductor 22. Thus, semiconductors 24 and 25 are specified to be hard type II superconductors with a high critical current density, for example lead telluride or gallium arsenide. Sustaining the voltage across elements 211 – 21$p$ and superconductor 22 calls for insulator 23 in the form of a dielectric. It is possible, by using dielectric screens, for the dielectric to be at room temperature, liquid nitrogen temperature (about 80° K) or, indeed, any other temperature, but it is more convenient and therefore preferred to have the dielectric 23 at the same temperature as the conductors 21, 22 and semiconductors 24, 25. Dielectric strength, of course, is the ability of dielectric 23 to withstand the voltage being applied between superconductors 21, 22. Most plastics have too high a loss at 4° K to be used as solids. Since low temperature dielectrics cannot withstand very high electric fields reliably, the dielectrics suitable for use at cryogenic temperatures are vacuum, helium (liquid, subcooled liquid or supercritical), and wound foil insulation impregnated with helium or foil insulation in vacuum as described at pages 460 – 478 in the reference by S. Foner and B. Schwartz. Thus, insulator 23 may be specified as a vacuum at cryogenic temperatures. Insulator 23 can also be specified as a bulk oxide, for example silicon oxide.

In operation, application of transfer voltages $V_1 - V_p$ to superconductors 211 – 21$p$ produce current densities $J_s$ flowing through insulator 23 and semiconductors 24 and 25. Superconductors 211 – 21$p$ each plays the role of superconductor 21 of FIG. 1D. Although the transfer voltage source is described providing a reverse bias to superconducting capacitor it should be understood that it can provide a forward bias equally well as desired. Thus, transfer voltages $V_1 - V_p$ can be any combination of positive and negative voltages. The net effect of applying voltages $V_1 - V_p$ to elements 211 – 21$p$ is the creation of electric F and magnetic B fields between superconductors 21 and 22 as explained previously in connection with the discussion of FIG. 1D. The electric field is created by virtue of the fact that supercharge accumulates on superconductors 21 and 22 and across the barriers of insulator 23 and semiconductors 24 and 25 while the magnetic field is created by virtue of the presence of supercurrent density $J_s$ which flows through insulator 23 and semiconductors 24 and 25. The two fields are confined to the space between metal plates 21 and 22 and define potential wells in semiconductors 24 and 25. The energy densities of the electric and magnetic fields are given, respectively, by equations (1) and (2).

In FIG. 4 the essential idea is to store energy in the form of electric charge in electric and magnetic potential wells which are created in semiconductors 24 and 25 through application of transfer voltages $V_1 - V_p$ to elements 211 – 21$p$. Power source 1 provides current $I_{in}$ to the input diode 26 of superconducting capacitor 2. The application of transfer voltages $V_1 - V_p$ to elements 211 – 21$p$ creates electric and magnetic potential wells in the region between superconductors 21 and 22 and, as a consequence, it is possible to draw charge Q' from the region of input diode 26 which acts as a source of charge. As voltages are applied to the individual CCD (charge coupled device) elements 21 (collectively 211 – 21$p$) and adjusted in amplitude, time duration, and sequencing, the electric and magnetic potential wells underlying each element 21 can be moved from one element to adjacent ones and thusly to the output element 21$p$ where the charge contained in the potential wells can be detected in output diode 27 and provided for consumption in the form of output current $I_{out}$ to load 3. The operation of CCD devices is more fully explained in the reference by G. F. Amelio. In particular, it should be appreciated by those skilled in the art that elements 21 can be resonated using their internal distributed inductances or by adding a coil in series (or in parallel) with each element.

It is of interest now to consider the semiconductor 24 surface potential, insulator 23 thickness, and depletion-width of semiconductors 24 and 25, when a transfer voltage V is applied between superconductors 21 and 22. This can be done with the help of the reference by W. S. Boyle and G. E. Smith.

$$V_s = (1 - \frac{Q'}{Q}) V \qquad (3)$$

$$d = \frac{V}{s} \qquad (4)$$

$$d_s = (\frac{\epsilon V_s}{eN})^{1/2} \qquad (5)$$

where $V_s$ is the potential appearing across semiconductor 24, $d$ is the thickness of insulator 23, and $d_s$ is the semiconductor 24 and 25 depletion width. In addition, $Q'$ is the charge obtained from input current $I_{in}$, $Q$ is the steady state carrrier charge, $s$ is the dielectric strength of insulator 23, $\epsilon$ is the permittivity of semiconductor 24 and 25, $e$ is the electron charge, and $N$ is the donor semiconductor density. It should be understood that while the present description is provided, by way of example, in terms of the depletion of semiconductors 24 and 25, the enhancement of same is equally possible.

Thus, the transfer of charge from input diode 26 to output diode 27 can be in terms of either or both of electrons or holes; all that is needed is to appropriately dope semiconductors 24 and 25. In FIG. 4 semiconductor 24 may be specified as an n-type semiconductor for attracting electrons when a transfer voltage V is applied to superconductor 21 while semiconductor 25 may be specified as a p-type semiconductor for attracting holes. Examples of semiconductors are silicon, lead telluride, and gallium arsenide. Preferably, semiconductors 24 and 25 are hard type II superconductors for reducing the power dissipation. It will be appreciated by those skilled in the art that type II superconductors can be obtained by impurity doping type I superconductors.

Equation (3) shows that the presence of charge Q' in the region between superconductors 21 and 22 increases the voltage $V - V_s$ appearing across insulator 23 and, as a consequence, increases the current $I - I_s$ which flows through insulator 23 and semiconductors 24 and 25 thereby producing more electric and magnetic fields F and B and, in view of equations (1) and (2), storing more energy.

It will be appreciated by those skilled in the art that an equivalent network consisting of an inductance $L = lA$ in series with a parallel combination of a capacitance $C = cA$ and conductance $G = gA$, where $l, c, g$ are the inductance, capacitance and conductance per unit area and A is the element area, can be postulated for elements 211 - 21p in FIG. 4.

In particular, it will be appreciated by those skilled in the art, that the effect of the inductance L is to cause the apparent capacity C' of the element, as observed at its terminals 21 and 22, to be greater than the actual capacity C according to the equation $$C' = \frac{C}{1 - \omega^2 LC} \tag{6}$$

where L and C are the inductance and capacitance in farads (F) and henries (H), respectively, and $\omega = 2\pi f$ is $2\pi$ times the frequency $f$ in hertz (Hz). Clearly, the difference between the apparent and actual capacities is negligible except when $\omega^2 LC$ approaches unity for which case the apparent capacity increases very rapidly. As a consequence, the energy which can be stored in a resonating element 211 - 21p becomes very large when $\omega^2 LC = 1$. The resonating of elements 211 - 21p is a preferred technique of the present invention.

Referring to FIG. 3, the energy storage capacity of a Josephson junction (metal 21 - oxide 23 - metal 22) includes Josephson, magnetic, and capacitive coupling and is given by $$C_s = \frac{\frac{4}{\pi}\Phi_o J_c(\frac{\lambda J}{a}) + 2c(\frac{\Delta}{e})^2}{\rho(2\lambda + d)} \tag{7}$$

where $\Phi_o 2 \times 10^{-15}$ Wb is the flux quantum, $J_c$ is the critical supercurrent density, $\lambda J$ is the Josephson penetration depth, $a$ is the junction length, $c$ is the capacitance per unit area, $\Delta/e$ is the voltage gap ($\Delta$ = energy gap, $e$ = electron charge), $\rho$ is the density of the junction, and $2\lambda + d$ is the height of the junction ($\lambda$ = flux penetration depth, $d$ is barrier or oxide 23 thickness). In the system of the present invention, maximizing the energy storage capacity of a Josephson junction requires maximizing the numerator and minimizing the denominator of equation (6). To this end, using typical values of the state-of-the-art of $J_c = 10^{10}$ A/m², $\lambda_J/a = 10^{-1}$, $c = 10^1$ F/m², $\Delta/e = 10^{-2}$ V, $\rho 2 \times 10^4$ lb/m³, and $2\lambda + d = d = 10^{-9}$ m (since type II superconductors exclude the flux, $\lambda = 0$), produces the storage capacity of 2 J/lb (1/1800 WH/lb).

The supercurrent $J_c$ in a junction 211 - 21p of FIG. 3 (oxide 23 sandwiched between metal electrodes 21 and 22) is destroyed when the junction is operated beyond its gap voltage $\Delta/e$. As a consequence, equation (7) is no longer valid. The storage of energy, therefore, in an element of the invention which operates above its gap voltage $\Delta/e$, for example elements 211 - 21p in the systems of FIGS. 2 and 4, exclude the Josephson effect and have energy storage capacity given by $$C_s = \frac{c(V - V_s)^2}{2\rho(2\alpha + d)} \tag{8}$$

where $c$ is the capacitance per unit area, $V - V_s$ is the voltage appearing across dielectric 23, $\rho$ is the element density, $\alpha$ is the height of superconductors 21 and 22, and $d$ is the height of dielectric 23. The loss is given by $$L_s = \frac{\omega c(V - V_s)^2 \tan \delta}{\rho(2\alpha + d)} \tag{9}$$

where $\omega$ is the angular frequency, $c$ is the capacitance per unit area, $V - V_s$ is the voltage appearing across dielectric 23, and tan δ is the dissipation or loss factor. As equation (9) shows, the dielectric 23 losses are proportional to $(\omega CV)^2$, the capacitive wattless power of the transmission line (delay line or cable). It is important to note that $2\alpha + d$ must be replaced by $2\alpha$ in equations (8) and (9) when dielectric 23 is a vacuum or helium, i.e., when dielectric 23 contributes no material to the space between superconductors 21 and 22.

Clearly, maximizing the numerator and minimizing the denominator of equation (8) increases the power loss of equation (9). More appropriately, therefore, it is desired to maximize the energy storage of an element while at the same time minimizing the power loss, i.e., maximizing the ratio of equations (8) and (9), namely $$\frac{C_s}{L_s} = \frac{1}{2\omega \tan \delta} \tag{10}$$

which indicates, in the system of the present invention, that maximizing the energy storage capacity of a system element 211 - 21p requires minimizing the denominator of equation (10). This can be done by operating the system at dc or specifying dielectric 23 as a low loss dielectric when operating the system with ac. Dimensionally, the ratio $C_s/L_s$ of equation (10) represents a time. More specifically, equation (10) represents the time T which is required to dissipate an energy equalling the energy stored. If the element access or dwell time is $T_a$, then the energy dissipated during access, i.e., when applying transfer voltage V and current I to elements 211 - 21p is $L_s T_a$, which permits defining the system efficiency $\eta$ as $$\eta = \frac{1}{1 + \frac{T_a}{T}} \tag{11}$$

which indicates that if a system efficiency of 50% or better is desired, the dissipation time T must equal or exceed the access or dwell time $T_a$, i.e., $T_a \leq T$.

In operation, a potential well is first created in semiconductors 24 and 25 by applying a transfer voltage V and current I to superconductors 21 and 22 during the access time $T_a$. After the potential well has been created in semiconductors 24 and 25, charge Q' flows into the well from an adjacent element and the voltage $V - V_s$ and current $I - I_s$ appear across dielectric 23 with result that the energy is stored in the form of charge in the potential well. Once stored, $V_s = 0$ and the charge will remain stored with a power loss given by equation (9) for the duration of the potential well's existence, i.e., during the access time $T_a$. It is important therefore to minimize the power loss given by equation (9). To this end, using typical values of the state-of-the-art of $\omega = 2\pi \times 60$ Hz and tan $\delta = 10^{-7}$ produces the dissipation time $T = 1.34 \times 10^4$ seconds. This means that the access time, for 50efficiency or more, must equal to or be less than $1.34 \times 10^4$ seconds (3.7 hours). The energy storage capacity and power loss can be found using equations (8) and (9) which, for $c = \epsilon/d$, $V_s = 0$ and $V = sd$ where $s$ is the dielectric strength and $d$ is the height of dielectric 23, become $$C_s = \frac{\epsilon s^2}{2\rho} \left( \frac{d}{2\alpha} \right) \text{ and } L_s = \omega \epsilon s^2 \tan \delta \left( \frac{d}{2\alpha} \right)$$

for the case of a vacuum dielectric 23. Using the values of the present example of $\omega = 2\pi \times 60$ Hz, tan $\delta = 10^{-7}$ and, in addition, $s = 10^8$ V/m, $\rho = 10^4$ lb/m³, and $d/2\alpha = 10$, produces the energy storage capacity $C_s = 50$ J/lb ($1.4 \times 10^{-2}$ WH/lb) and power loss of $L_s = 3.75 \times 10^{-2}$ W/lb.

To gain some perspective, the lead-acid battery can store about 10 WH/lb which can be converted to power at high efficiency, and gasoline has a storge capacity of about 6000 WH/lb which can be converted to mechanical power at low efficiency. However, it has been estimated that a 50 WH/lb battery can compete with gasoline because electrical power can be used more efficiently than mechanical power. This can be seen in the reference by C. J. Lynch. Furthermore, the superconducting coil can store about 0.6 WH/lb as shown in the reference by Z. Stekly and R. Thorne. Clearly, while the non-resonating elements of FIGS. 2, 3 and 4 have the potential they fall short when considered for storing energy in potential form. It is possible, however, to increase the storage capacity of elements to a useful level if the energy is stored in a resonating circuit for which $\omega^2 LC = 1$ or as kinetic rather than potential form and this, therefore, is the preferred apparatus and method of the invention.

It will be appreciated by those skilled in the art that elements 211 - 21p can be designed having a large apparent capacity C', given by equation (6), and that the apparent capacity per unit area $c' = C'/A$ can be used in lieu of the actual capacity per unit area $c = C/A$ in equations (7) and (8) for increasing the energy storage capacity. This type apparatus and method requires the design condition $\omega^2 LC = 1$ for resonating elements 211 - 21p. In operation, the transfer voltage V is applied at angular frequency $\omega$ and the charge Q' stored in a given element sloshes between the inductance L and capacitance C of an element or between two adjacent elements at the same frequency. If elements 211 - 21p are specified to resonate then, in view of the foregoing discussion in connection with equations (6) through (9), the energy which can be stored per element ($\omega^2 LC = 1$) is limited only by the selection of metal superconductors 21, 22, dielectric 23, and semiconductors 24 and 25 to handle the high currents, electrical and thermal insulation, and cooling requirements.

It will be appreciated by those skilled in the art that potential wells can be formed and moved from element to element, for example as suggested in the references by T. Fulton et al., for creating and moving vortices, and G. Amelio, for creating and moving charges, and that kinetic energy can be imparted or removed from the moving vortices and charges as desired. If a given system of the invention comprises p arrayed elements, for example in a delay line or shift register, and if the potential energy which can be stored per element is E, then the kinetic energy which can be stored per element is pE which indicates, in view of the previous discussion in connection with equations (7) through (9), that the effective transfer voltage is $p^{\frac{1}{2}}V$ (or effective current is $p^{\frac{1}{2}}I$) when the energy stored is in the form of kinetic rather than potential energy. If elements 211 - 21p are specified for imparting and removing energy from vortices and charges then the kinetic energy pE which can be stored per element is limited only by the state of the art of selections for superconductors 21, 22, dielectric 23, and semiconductors 24 and 25 to handle high currents, electrical and thermal insulation, and cooling requirements. It will also be apreciated by those in the art that the storage of kinetic energy in a p-element delay line can be prolonged beyond the delay time provided by a single transit of the vortex or charge by recirculation, i.e., by feeding the output of the p element delay line back to its input. In any case, energy may be imparted or removed from the moving vortices or charges by applying and removing transfer currents or voltages in some sequence to the individual elements as desired. In particular, kinetic energy is removed by passing the moving vortices or charges by elements having no applied transfer voltages or charges or having reverse (opposing) transfer voltages, for example by passing vortices or charges by a diode 27.

In FIGS. 3A – 3C, metal electrodes 21 and 22 carry heavy currents while insulator 23 has a relatively low voltage. Accordingly, metal electrodes 21 and 22 may be specified as type II superconductors, for example niobium, while insulator 23 may be specified as an oxide, for example silicon oxide. It will be appreciated by those in the art that the metal 21 - insulator 23 - metal 22 junction may use a thin or thick film or bulk barrier oxide insulator 23 which may operate as a normal or Josephson junction as desired. Also, the geometrical configuration of metal electrodes 21 and 22 may be as desired, for example as flat plate or circular plate junctions, for implementing any one of an array of resonating junctions 211 - 21p or for imparting kinetic energy to the vortices and charges. Finally, any one or more of a ground plane, overlay or underlay, 28, for example glass, may be utilized, the main consideration for the system of FIG. 3 being the tasks of resonating junctions 211 - 21p, and/or imparting and removing kinetic energy to the vortices and charges, maximizing the current density of metal electrodes 21 and 22, and applying the logical sequence of transfer currents I or voltages V to move vortices and charges along the delay line.

In FIG. 4, metal electrodes 21p carry large currents while insulator 23 has a relatively high voltage. A heavy current is also carried by semiconductors 24 and 25. Accordingly, metal electrodes 21 and 22 may be specified as superconducting metals, for example niobium, while insulator 23 may be specified as a dielectric, for example air. Of course, the dielectric 23 may also comprise a deposited insulator like silicon oxide, silicon dioxide, silicon nitride; or a grown oxide, for example lead oxide. Semiconductors 24 and 25 consist preferably of a superconductive semiconductor with a high critical temperature $T_c$, such as the lead salts, more particularly the sulfides, selenides, tellurides of lead, or intermetallic compounds like indium telluride, tin arsenide, to tin antimonide, or as suggested in the tables at page 342 in the reference by L. Solymar. Lead telluride (PbTe) is particularly advantageous because it becomes superconductive at about 5° K. Since the boiling point of liquid helium is 4.2° K, maintenance of the temperature below the critical temperature for PbTe is no problem. Aluminum, gallium, titanium, tantalum, zinc, manganese or bismuth is a suitable n-type dopant for PbTe. Thalium is an appropriate p-type dopant for PbTe. Of course, semiconductors 24 and 25 may also comprise superconductive semiconductors with a low critical temperature like strontium titanate and germanium telluride. Also, the geometrical configuration of metal electrodes 21 and 22 may be as desired, for example as flat plate or circular plate capacitors, for implementing any one of an array of resonating capacitors 21$1$ – 21$p$ or for imparting kinetic energy to the charges. Finally, any one of a ground plane, overlay or underlay support may be utilized; the main considerations for the system of FIG. 4 being the tasks of resonating capacitors 21$1$ – 21$p$, and/or imparting and removing kinetic energy to the charges, maximizing the current density of semiconductors 24 and 25, and applying the logical sequence of transfer voltages V to move charges along the delay line. Such tasks are well known per se in the electrical power generation and transmission arts, in the superconducting and computing arts and will, therefore, be obvious to those skilled in these arts.

Figure 5:
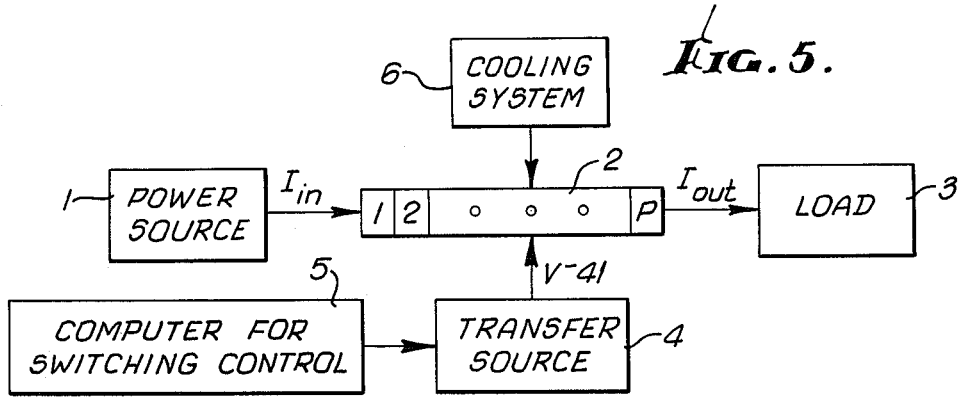
FIG. 5 shows a general block diagram of the system of the invention.

FIG. 5 shows a block diagram of the system of the present invention in which a power system 1, such as fossil, nuclear, solar, and so forth power plant, provides source current $I_{in}$ to a $p$ element delay line in accordance with the system of the present invention. Transfer source 4 provides voltage V 41 for forming potential wells in the individual elements and for moving vortices or charges through the delay line. A computer 5 may be utilized to program the amplitude, time-duration, and sequencing of transfer voltage V 41 to the individual elements.

Notwithstanding the shift register illustrations of FIGS. 2 through 5, superconducting capacitor 2 may assume any one of a number of forms, for example it may be connected to operate as a serial access, parallel access, or random access energy store. The elements of superconducting capacitor 2 may assume any one of a number of forms including CCD (Charge-Coupled Device), MOS (Metal-Oxide Semiconductor), CMOS (Complementary Metal-Oxide Semiconductor) and SOS (Superconductor-Oxide-Superconductor) tunnel junctions, Pb-Cu-Pb junctions, Anderson-Dayem bridges, Notarys bridges, point contact junctions, slug devices and so forth singly or forming a field or mosaic of like devices in a serial, parallel, or random access energy store. Various materials, devices, and techniques which may be utilized may be found in references by G. F. Amelio, J. Clark, T. A. Fulton et al, and Z. Stekly and R. Thorne.

The $p$ elements of the superconducting capacitor may be interconnected in any one of a number of ways, for example the $p$ elements may be connected in parallel with elements of a subgroup connected in series. The elements may be connected for serial, parallel, or random access with elements in series or in parallel or subgroupings of superconducting capacitor devices may be connected in series or in parallel and so forth. In any connection of the elements of superconducting capacitor, the loading and unloading cycle of elements occurs under control of computer 5 which controls the amount, timeduration, and sequencing of transfer voltages V 41 applied to metal electrodes 21 of elements of superconducting capacitor thereby controlling the storing, moving about, and reproduction of charges Q' between the input diode 26 and output diode 27 and providing output current $I_{out}$ to load 3 as desired.

In operation, the charge Q' is collected in the region between metal electrodes 21 and 22 and is moved at will between the input diode 26 and output diode 27. Each element of the superconducting capacitor stores the energy in the form of charge in the sharply defined electric and magnetic potential wells associated with each metal electrode 21. Thus loading metal electrode 21 means dumping the charge Q' in its associated potential wells defined by voltage $V_s$ and current $I_s$. As the charge Q' accumulates the voltage $V_s$ and current $I_s$ tend to drop as predicted by equation (3) and theoretically will drop to zero when Q' = Q, i.e., when the charge Q' provided by the input current $I_{in}$ equals the steady state carrier charge Q. Importantly the voltage $V - V_s$ and current $I - I_s$ appearing across dielectric 23 will rise. The charge Q' once accumulated remains in the region underlying metal electrode 21 until it is needed at which time it is moved to an adjacent region or directly to the output diode 27 and output current $I_{out}$ into load 3.

As shown in the reference by G. F. Amelio it is possible to store any one of a discrete number of charge levels in each element of a superconducting capacitor. Thus, quantizing of the elements of superconducting capacitor requires operating the transfer voltage V 41 at a number of discrete levels and this can be easily accomplished through computer 5 control of transfer source 4 for providing the various levels. The actual number of elements $p$ and quantizations $q$ of elements of superconducting capacitor are determined by the application which seeks to meet the requirement and reduce the cost. The system of the present invention therefore has the potential of operating with a number of elements $p$ each element having $q$ quantizations with elements operating at high voltage, the actual operation and implementation being determined by the application.

Thus, in accordance with the system of the present invention, the energy is stored in a resonating element for which $\omega^2 LC = 1$ and/or is stores as kinetic energy. In general, therefore, the stored energy per element is given by $$E = p q \rho v C_s \qquad (12)$$

which postulates $pq$ times the potential energy $\rho v C_s$ (or its equivalent $1/2CV^2$) which can be stored in the element, where $v$ is the element volume for weight, $p$ is the number of arrayed elements imparting kinetic energy to the stored charge, and $q = C'/C$ is given by equation (6). If kinetic energy is not imparted to the charge, $p =$ 1 in equation (12). The total energy which can be stored in a $p$ element system is therefore $pE$.

An example of an energy storage system which is needed to provide 1000 MWH (megawatt hours) in an electric utility can be found by solving $pE = 1000$ MWH. Using the typical values of $q = 10^4$, $\rho = 10^4$ lb/m$^3$, $v = 10^{-1}$ m$^3$, and $C_s = 10^{-2}$ WH/lb, indicates that $p = 10^4$ elements are needed without imparting kinetic energy to the charges and only 100 resonating elements are needed when imparting kinetic energy to the charges. In terms of size and weight, the former system requires $10^3$ m$^3$ volume and $10^7$ lbs weight (5,000 tons) while the latter system requires 10 m$^3$ volume and $10^5$ lbs weight (50 tons).

In another example, a 1000 KWH (kilowatt hour) unit for use in a small factory or home needs about 10 resonating elements without imparting kinetic energy to the charges and only 3.3 resonating elements when imparting kinetic energy to the charges. In terms of size and weight, the former system requires 0.33m$^3$ volume and 3300 lbs weight.

In yet another example, an energy storage system which is needed to provide the 100 KWH of a tank of gas for a large truck requires one resonating element without imparting kinetic energy to the charges. In terms of size and weight, the system requires 0.1 m$^3$ volume and $10^3$ lbs weight.

Clearly, from the foregoing, either method or a combination thereof may be utilized to implement an energy storage system, i.e., resonating elements alone in a $p$ element delay line or resonating elements and imparting kinetic energy to the charges may be utilized.

It will be appreciated that the examples given do not account for the detailed actual designs, nor for the voltages, frequencies, thermal and cooling requirements, and efficiencies which may be encountered in practice. These are provided only to give a first magnitude perspective of the energy storing capability of the present invention which, clearly, has the potential of providing high energy in low weight and in small size apparatus. That this can be accomplished at low cost will now be discussed.

The major cost of a system in accordance with the present invention may well rest in the feasibility of cheaply providing the bulk oxide 23 and bulk semiconductors 24 and 25. For example, it is well known that solar cells are rather expensive but nevertheless can currently be provided at a capital cost of about $11/lb. This can be seen in the article by W. C. Brown "Satellite Power Stations: A New Source of Energy?" appearing in the March 1973 issue of IEEE Spectrum which gives a capital cost of providing silicon material for the solar cell at about $1100/KW, and the article by W. I. Berks and W. Luft "Photovoltaic Solar Arrays for Communication Satellites" appearing in the February 1971 issue of Proceedings of the IEEE which gives a specific power of about 10 W/lb, the product $1100/KW × 10W/lb giving the aforementioned present cost of $11/lb. Furthermore, as shown in the reference by W. C. Brown, there is a reasonable chance for reducing the cost to about $3.5/lb when allowing for future breakthroughs in manufacturing techniques used to provide bulk semiconductors. For the moment the capital cost of the silicon material is about $11/lb. On this basis and excluding the costs for metal plates 21 and 22, voltage source 4 and cooling system 6, the projected cost of the electric utility storage example is $11/lb × (2.5 × 10$^6$ lbs) or about 27.5 million dollars. On the other hand the cost of the home storage example is $11/lb × 600 lbs or about $6600 while the cost of the car storage example is $11/lb × 80 lbs or about $880.

From the foregoing it will be appreciated that, in addition to an uncomplicated method, the invention also provides an uncomplicated apparatus for storing electrical energy, i.e., apparatus comprising $p$ resonating elements 21$_1$ - 21$_p$ arrayed in a transmission line. For example, it has been found that the energy storage capacity ($pq \times 10^{-2}$ WH/lb) of the invention as opposed to prior art energy storage systems is over 100% as the product $pq$ increases beyond 1,000. From this brief comparison of the improved results of the invention over prior art apparatus and methods, it will be appreciated that the invention results in energy storage systems that are suitable for use where prior art energy storage systems are unsuitable. For example, because of the reduction in weight, size and power requirements, and increase in efficiency, the invention allows superconducting energy storage systems to be built for public utilities, factories, homes, vehicles, ships, and spacecraft among others. Clearly, the system of the invention has the potential for implementing high energy storage capacity systems having low weight, small size, and low cost.

Finally, it will be appreciated by those skilled in the art and others that a variety of modifications can be made within the scope of the invention. That is, a variety of materials and geometries, voltages, frequencies, thermal and cooling systems, and efficiencies can be used, and a variety of enhancing or depleting semiconductors 24 and 25 can be used to carry out the invention. Hence the invention can be practiced otherwise than as specifically described herein. Thus, although a number of configurations of a superconducting energy storage system have been described, it should be understood that the scope of the invention should not be considered to be limited by the particular embodiments illustrated, by way of example, but rather by the appendant claims.

I claim:

1. A cryogenic energy storage system comprising:
a plurality of charge coupled energy storage elements for storing electromagnetic energy in the form of charges in commercial power amounts, such as kilowatts;
means for interconnecting said elements in an array of elements, including input, output, and intermediate elements;
refrigeration means for cooling at least portions of said elements to cryogenic temperatures;
means for connecting a source of electrical energy to said input elements for feeding energy to said system, with energy fed to said input elements propagating to said output elements through said intermediate elements;
means for controlling the travel time of said charges between said elements and including a transfer source for applying one of transfer control currents and voltages to selected elements for transferring charges from element to element; and
means for connecting a load to said output elements for consuming energy provided by said system.

2. The system of claim 1 including means for increasing the stored energy by imparting kinetic energy to said stored charges.

3. The system of claim 1 including means for operating said elements as a transmission line.

4. The system of claim 1 including computer means for accessing said elements and for providing the logic and control functions of receiving, storing, propagating, and recovering energy in said system.

5. The system as defined in claim 1 including means for resonating said elements for increasing the stored energy.

6. The system as defined in claim 1 wherein said energy storage elements are charge coupled capacitors.

7. The system of claim 6 wherein said elements comprising charge coupled devices include a first metal - insulator - first semiconductor - second semiconductor - second metal sandwich.

8. A method of cryogenic energy storage comprising the steps of:
   connecting a plurality of charge coupled energy storage elements capable of storing electromagnetic energy in the form of charges in commercial power amounts, such as kilowatts, in an array of elements, including input, output, and intermediate elements;
   cooling said elements to cryogenic temperatures;
   feeding a source of electrical energy to the input elements;
   forming charges in the elements;
   propagating charges through the array of elements by applying a source of one of a transfer control current and voltage to selected elements to move charges from element to element; and
   recovering the charges from the output elements.

9. The method of claim 8 including the steps of:
   generating a transfer source of current or voltage;
   applying the transfer source to the elements;
   forming potential wells in the elements;
   capturing the charges in the potential wells; and
   moving the charges from element to element by moving the potential wells.

10. The method of claim 8 including the step of imparting kinetic energy to the charges.

11. The method of claim 8 including forming a transmission line.

12. The method of claim 8 including the steps of:
    accessing the element; and
    providing the logic and control functions of storing, propagating, and recovering energy in the system.

13. The method as defined in claim 8 including the step of resonating the elements of the array for increasing the stored energy.

* * * * *